United States Patent [19]

Watanabe et al.

[11] Patent Number: 4,845,672
[45] Date of Patent: Jul. 4, 1989

[54] MEMORY CIRCUIT WITH ACTIVE LOAD

[75] Inventors: Kazuo Watanabe; Masatoshi Yano, both of Kanagawa, Japan

[73] Assignee: Sony Corporation, Tokyo, Japan

[21] Appl. No.: 215,001

[22] Filed: Jun. 24, 1988

Related U.S. Application Data

[63] Continuation of Ser. No. 901,124, Aug. 28, 1986, abandoned.

[30] Foreign Application Priority Data

Aug. 28, 1985 [JP] Japan .................. 60-188896

[51] Int. Cl.4 .............. G11C 7/00; G11C 11/40
[52] U.S. Cl. .................... 365/190; 365/208; 365/227; 307/530
[58] Field of Search .......... 365/189, 190, 205, 207, 365/208, 227, 233, 203; 307/530

[56] References Cited

U.S. PATENT DOCUMENTS

| | | | |
|---|---|---|---|
| 4,114,192 | 9/1978 | Suzuki et al. ............. | 365/190 |
| 4,272,834 | 6/1981 | Noguchi et al. ........... | 365/189 |
| 4,379,344 | 4/1983 | Ozawa et al. ............. | 365/190 |
| 4,412,143 | 10/1983 | Patella et al. ........... | 365/208 |
| 4,421,996 | 12/1983 | Chuang et al. ............ | 365/205 |
| 4,507,759 | 3/1985 | Yasui et al. ............. | 365/189 |
| 4,639,900 | 1/1987 | Koshizuka ................ | 365/208 |
| 4,665,507 | 5/1987 | Gondou et al. ............ | 365/190 |
| 4,739,499 | 4/1988 | Simpson .................. | 365/205 |
| 4,760,561 | 7/1988 | Yamamoto et al. .......... | 365/190 |

FOREIGN PATENT DOCUMENTS

| | | | |
|---|---|---|---|
| 0208690 | 12/1982 | Japan ................... | 365/205 |
| 57-208690 | 12/1982 | Japan . | |
| 0091591 | 5/1983 | Japan ................... | 365/227 |

OTHER PUBLICATIONS

Minato et al., "A HI-CMOS 11 8k x 8b Static RAM", IEEE ISSCC Dig. of Tech. Papers, 2-12-82, pp. 256-257, 332.
Minato et al., "2k x 8 bit Hi-CMOS Static RAMs", IEEE Journal of Solid-State Circuits, vol. SC-15, 1980, No. 4, pp. 656-660.
Isobe et al., "An 18 ns CMOS/SOS 4k Static RAM", IEEE Journal of Solid-State Circuits, vol. SC-16, 1981, No. 5, pp. 460-465.
Ochii et al., IEEE Journal of Solid-State Circuits, vol. SC-17, 1982, Np. 5, pp. 798-803, "An Ultra Low 8k x 8-Bit Full CMOS RAM with a Six Transistor cell".
Hardee et al., "A 30 ns 64k CMOS RAM", IEEE International Solid-State Circuits Conference 27, 1984, Conf. 31, pp. 216, 217, 341.

Primary Examiner—Terrell W. Fears
Assistant Examiner—Glenn A. Gossage
Attorney, Agent, or Firm—Hill, Van Santen, Steadman & Simpson

[57] ABSTRACT

A memory circuit incorporates a plurality of memory cells arranged in matrix form, with a data line drive circuit having an active load circuit including two MOS transistors, operating as resistive elements during writing, and connected to the data line and the inverted data line of the cells. A differential amplifier is connected to the data line and inverted data line, and a plurality of constant current sources are connected to the transistors of the differential amplifier, with switching means causing one constant current source to be nonconductive during a write operation, with at least one of the current sources being normally on during reading and writing.

7 Claims, 11 Drawing Sheets

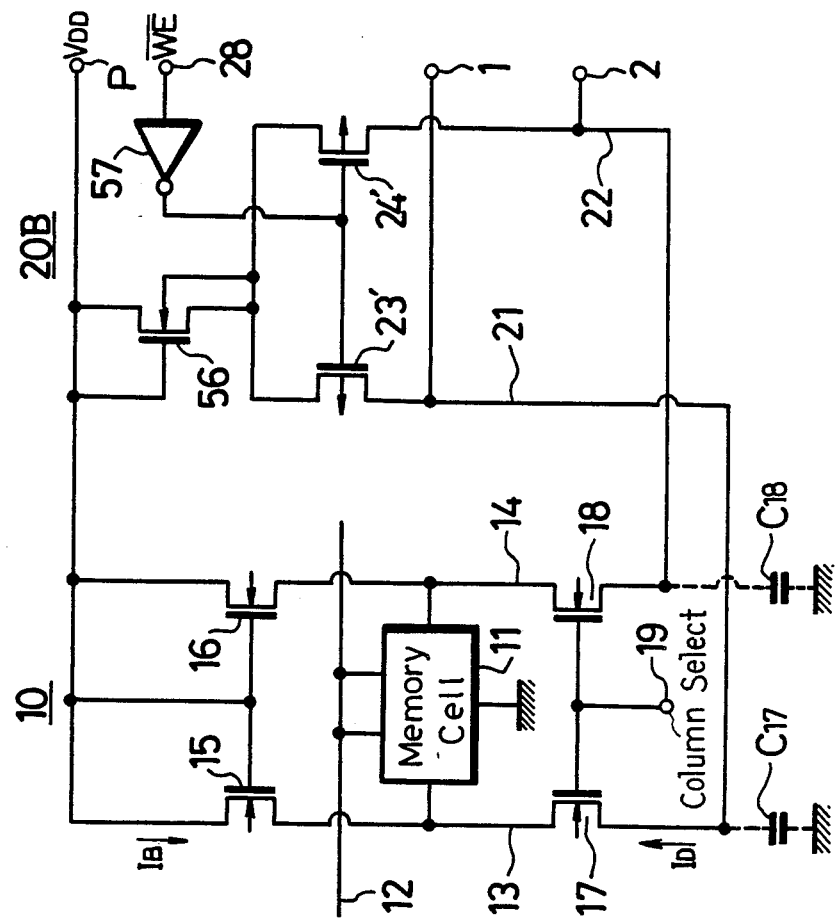

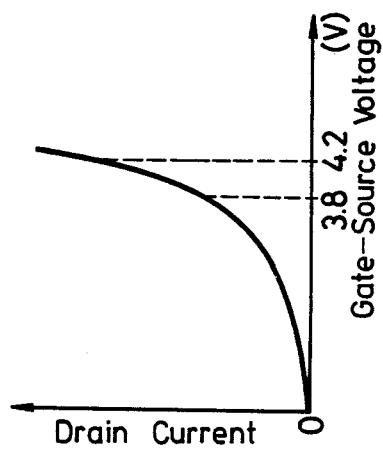
FIG. 14
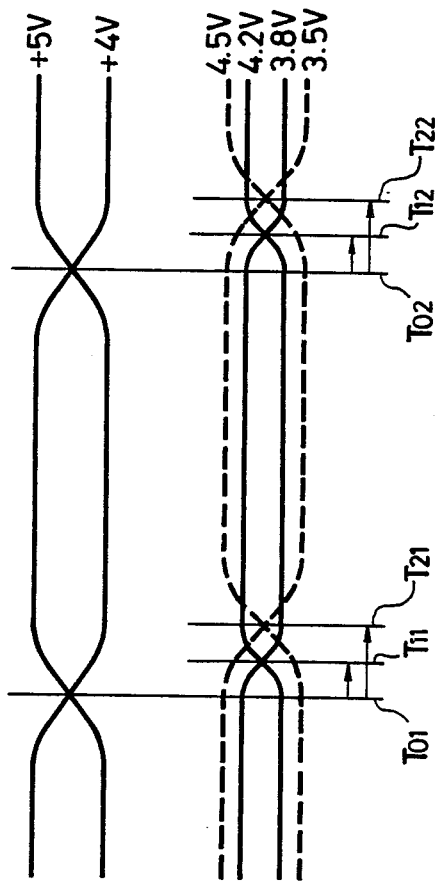
FIG. 15A
FIG. 15B

MEMORY CIRCUIT WITH ACTIVE LOAD

This is a continuation of application Ser. No. 901,124 filed Aug. 28, 1986 now abandoned.

BACKGROUND OF THE INVENTION

1. Field of the Invention

The present invention relates to a memory circuit.

2. Description of the Prior Art

In the prior art, a sense amplifier is used in order to amplify a fine read signal derived from an internal storage apparatus or external storage apparatus (memory) of an electronic calculator to a voltage level of a logic circuit.

In the case of a prior art memory circuit of, for example, a static type, its memory matrix is formed of a plurality of memory cells which are connected to a word line and to a pair of bit lines. Each memory cell includes a flip-flop circuit formed of a load resistor and an MOS (metal oxide semiconductor) transistor and stores an information in response to on and off of a current. The pair of bit lines are connected through a pair of N-channel MOS transistors to a power source terminal and further connected through a selection transistor formed of another pair of N-channel MOS transistors to a write circuit.

The write circuit includes a pair of N-channel MOS transistors which are controlled by an inverted write enable control signal and another pair of N-channel MOS transistors which are controlled by a write enable control signal. They are connected with a data line and an inverted data line and connected between the power source terminal and a data input terminal.

When the inverted write enable control signal is high in level, a data is read out from the memory and then delivered through a sense amplifier circuit formed of a differential amplifier circuit connected to the write circuit. Whereas, when the write enable control signal is high in level, a data supplied to the data input terminal is stored in the memory. However, in the above mentioned write mode, when a data "0" is written in the memory, the level at the output terminal of an inverter connected to the data input terminal becomes an earth potential so that a write current is flowed from the power source terminal through the inverted bit line and the inverted data line.

On the other hand, a MOS transistor of a constant current source in the differential amplifier circuit of the read circuit is supplied with a chip select signal so that regardless of the write mode and the read mode, if the chip select signal is high in level, the operation current is flowed to the differential amplifier circuit and thus the constant power is consumed. Accordingly, the power cosumption of the memory becomes more larger in the write mode so that the write current and the operation current of the differential amplifier circuit become as large as 1 M and 3 mA respectively although the above mentioned values are fluctuated on the basis of the operation speed of the memory.

OBJECTS AND SUMMARY OF THE INVENTION

Accordingly, it is an object of this invention to provide an improved memory circuit which can remove the shortcomings encountered with the prior art memory circuit.

It is another object of this invention to provide a memory circuit which can reduce the power consumption in the write mode.

According to one aspect of the present invention, there is provided a memory circuit comprising: a data input terminal;
a data output terminal;
a reference voltage source;
a memory matrix including a plurality of memory cells arranged in a matrix form, each column of said memory matrix including a pair of bit line and inverted-bit line connected to said plurality of memory cells in each column;
a data line driving circuit including;
a pair of data line and inverted data line connected to said pair of bit line and inverted-bit line, respectively;
active load means connected between said reference voltage source and said pair of data line and inverted data line;
switching means connected between said pair of data line and inverted data line and said data input terminal;
an inverted write enable signal input terminal connected to the control terminal of said active load means; and
a wrire enable signal input terminal connected to the control terminal of said switching means; and
a sense amplifier circuit comprising a differential amplifier including;
a pair of input transistors in differential configuration and connected to said pair of data line an inverted data line; the output terminal of one of said pair of input transistors being connected to said data output terminal; and
a plurality of constant current sources connected in parallel to the junction of said pair of input transistors; one of said plurality of constant current sources including a switching means controlled so as to be off state by an inverted write enable signal.

These and other objects, features and advantages of the present invetion will become apparent from the following detailed description of the preferred embodiments taken in conjunction with the accompanying drawings, throughout which like reference numerals designate like elements and parts.

BRIEF DESCRIPTION OF THE DRAWINGS

FIG. 7 is a circuit diagram used to explain the operation of the embodiment shown in FIG. 6;

FIG. 8 is a circuit diagram showing other embodiment of the memory circuit according to the present invention;

FIG. 14 is a graph used to explain the embodiment shown in FIG. 13;

FIGS. 15A and 15B are timing charts used to explain the operation of the embodiment shown in FIG. 13.

DESCRIPTION OF THE PREFERRED EMBODIMENTS

Now, the present invention will hereinafter be described in detail with reference to the attached drawings.

Figure 1:
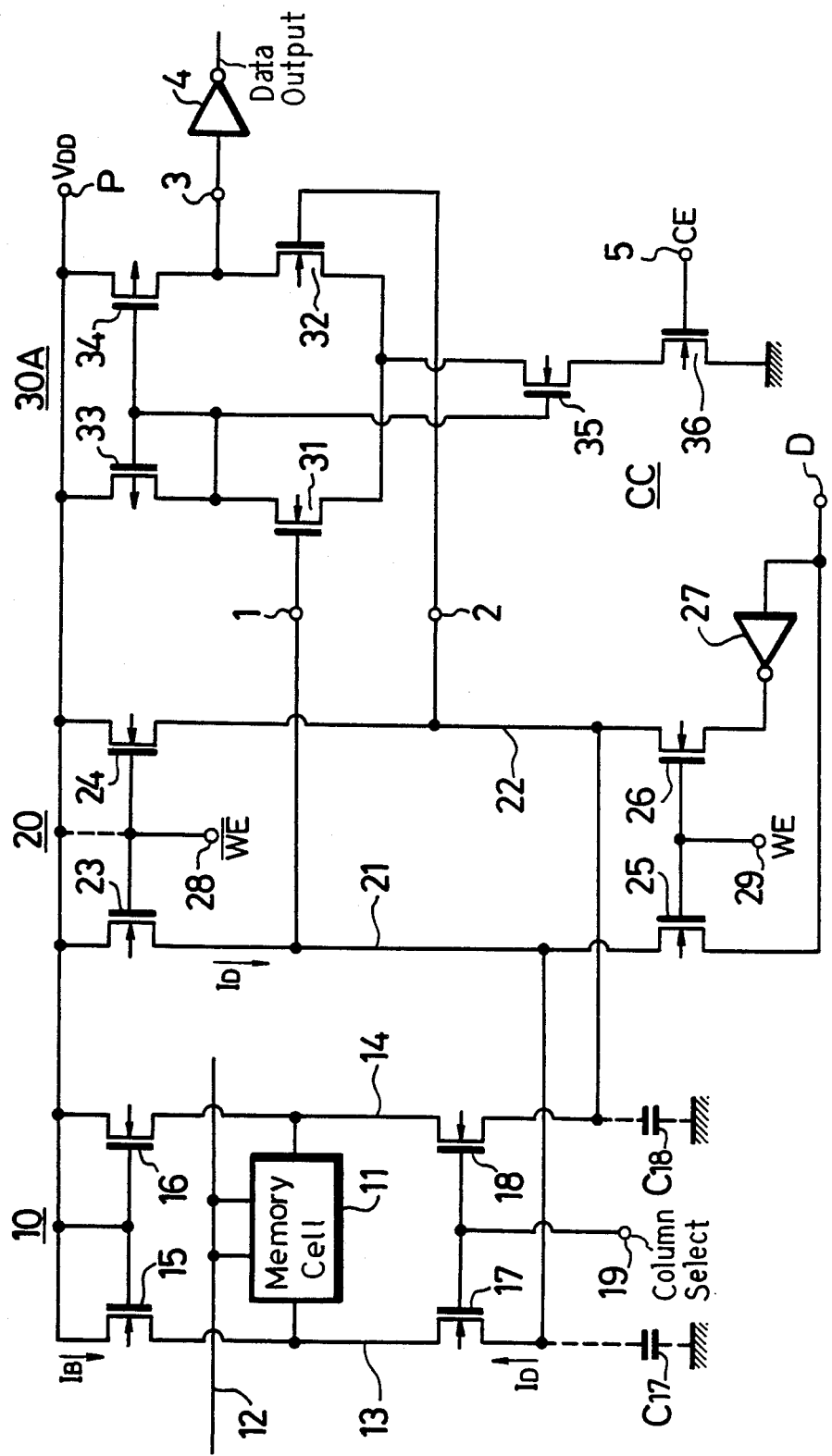
FIG. 1 is a circuit diagram showing an example of a main portion of a memory circuit to which the present invention is applied.

Referring initially to FIG. 1, a memory circuit to which the present invention can be applied will be described below.

In FIG. 1, reference numeral 10 designates a memory matrix which is formed of a given number of memory cells 11. This memory matrix 10 includes a flip-flop circuit formed of a load resistor and an MOS transistor though not shown and of a static type in which an information is stored in response to the on and off states of a current. Each memory cell 11 is connected to a word line 12, a bit line 13 and an inverted-bit line 14. One ends of the bit line 13 and the inverted-bit line 14 are connected respectively to ;sources of a pair of N-channel MOS transistors 15 and 16. The gates and drains of both the MOS transistors 15 and 16 are connected together to a power source terminal P. The other ends of the bit line 13 and the inverted-bit line 14 are respectively connected to drains of a pair of N-channel MOS transistors 17 and 18 whose gates are connected together to a column selection terminal 19.

A write circuit or data line drive circuit 20 includes data line 21 and an inverted data line 22 connected to the respective sources of the selection transistors 17 and 18 in the memory matrix 10. The data line 21 and the inverted data line 22 are connected through source drain paths of a pair of N-channel MOS transistors 23 and 24 to the power source terminal P and also to drains of another pair of N-channel MOS transistors 25 and 26, respectively. The source of the MOS transistor 25 is connected directly to a data input terminal D, while the source of the other MOS transistor 26 is connected through an inverter 27 to the data input terminal D. The gates of the MOS transistors 23 and 24 are connected together to an input terminal 28 of an inverted write enable signal $\overline{WE}$ while the gates of the MOS transistors 25 and 26 are both connected to an input terminal 29 of a write enable signal WE.

An initial stage amplifier circuit 30A of a sense amplifier constructs a current-mirror type differential amplifier circuit. That is, the data line 21 and the inverted data line 22 are connected respectively through input terminals 1 and 2 to gates of N-channel differential input MOS transistors 31 and 32 in the initial stage amplifier circuit 30A. The respective drains of both the N-channel MOS transistors 31 and 32 are connected to respective drains of a pair of P-channel MOS transistors 33 and 34 which are used as active loads. The gate and drain of the P-channel MOS transistor 33 are directly coupled with each other in a diode fashion, while the gate of the other P-channel MOS transistor 34 is connected to the gate of the MOS transistor 33. The respective sources of both the P-channel MOS transistors 33 and 34 are connected to the power source terminal P, thus constructing the current mirror circuit. The connection point or junction between the respective drains of the N-channel MOS transistor 32 and the P-channel MOS transistor 34 is connected to an output terminal 3. The sources of the N-channel MOS transistors 31 and 32 are connected together to a drain of a third N-channel MOS transistor 35 which is used as a constant current source. A bias voltage from the diode-connected P-channel MOS transistor 33 is applied to the gate of this MOS transistor 35 and the source of the MOS transistor 35 is grounded through a fourth N-channel MOS transistor 36 which is used as a switch, thus constructing the differential amplifying circuit having a constant current circuit CC. The gate of the MOS transistor 36 is connected to an input terminal 5 of a chip enable signal CE. An inverting amplifier circuit 4 is connected to the output terminal 3 of the differential amplifier circuit 30A.

Figure 2:
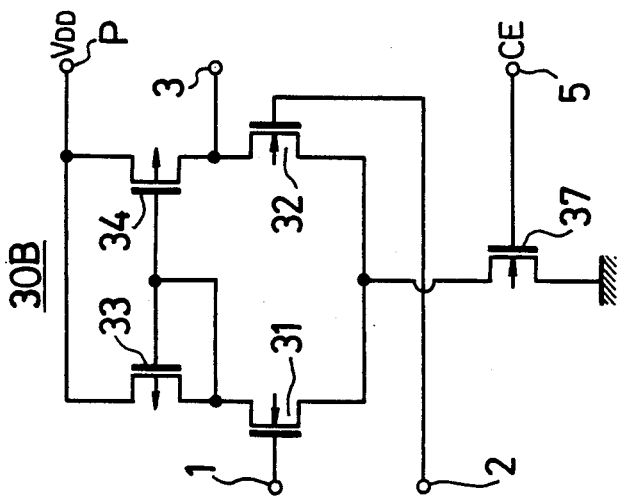
FIG. 2 is a circuit diagram showing another example of a sense amplifier usable in the memory circuit shown in FIG. 1.

The above mentioned differential amplifier circuit 30A can be replaced with a differential amplifier circuit 30B simplified in construction as shown in FIG. 2 in which the MOS transistor 35 in the current source section of the circuit 30A is replaced by a MOS transistor 37 which is also served as the switching MOS transistor 36 although a constant current characteristic thereof is deteriorated a little.

The operation of the memory circuit as mentioned above will be described below.

Upon reading, the write enable signal WE supplied to the terminal 29 of the write circuit or data line drive circuit 20 is made a low level so that both the MOS transistors 25 and 26 are turned off. As a result, the data line 21 and the inverted data line 22 are cut off from the data input terminal D. Meanwhile, the inverted write enable signal $\overline{WE}$ supplied to the terminal 28 is made a high level so that both the MOS transistors 23 and 24 are turned on. Further, the chip enable signal CE supplied from the terminal 5 to the differential amplifying circuit 30A is made a high level so that the switching MOS transistor 36 is turned on and thus the differential amplifier circuit 30A is placed in the operation mode.

The word line 12 is selected by an X decoder (not shown), whereby all the memory cells 11 connected to this word line 12 are activated and from a Y decoder (not shown), a column selection signal of high level for the predetermined bit line 13 and inverted bit line 14 is supplied through the terminal 19 to the MOS transistors 17 and 18. Then, both the MOS transistors 17 and 18 are turned on.

If the MOS transistor of the flip-flop circuit (not shown) within the memory cell 11 and connected to the bit line 13 is in the on-state, from the MOS transistor 23 of the data line drive circuit 20, a data line current $I_D$ is flowed to the memory cell 11 via the data line 21, the selection MOS transistor 17 and the bit line 13. The active load MOS transistor 15 connected to one end of the bit line 13 is in the on-state since a power source voltage $V_{DD}$ is supplied to the gate thereof. Then, a bit line current $I_B$ is flowed to the memory cell 11 via this MOS transistor 15. The sum of the bit line current $I_B$ and the above mentioned data line current $I_D$ becomes a suction current $I_M$ of the memory cell 11.

On the other hand, a MOS transistor (not shown) within the memory cell 11 and connected to the inverted bit line 14 is in the off-state so that no current is flowed to the memory cell 11 through the inverted bit line 14 and the inverted data line 22.

Accordingly, the potential $V_{13}$ and the potential $V_{14}$ at the bit line 13 and the inverted bit line 14 are different from each other. Then, the two different potentials or voltages $V_{13}$ and $V_{14}$ are supplied through the data line 21 and the inverted data line 22 to the gates of both the input MOS transistors 31 and 32 of the initial stage differential amplifier 30A of the sense amplifier as informations of the desired memory cell 11. A difference signal between the input signals is amplified and the unbalance output signal of the differential amplifying circuit 30A is supplied through the output terminal 3 to the inverting amplifying circuit 4.

When the power source voltage $V_{DD}$ is, for example, 5 Volts, the potential $V_{14}$ (having a higher level) of the inverted bit line 14 is lowered to about 3.2 Volts by the influence of the threshold voltage Vth (about 0.7 Volts) of the MOS transistor 16 and the substrate effect $\Delta$Vth (about 1.1 Volts). When the suction current $I_M$ of the memory cell 11 is, for example, 100 $\mu$A, the potential $V_{13}$ of the bit line 13 is a little lower than the potential $V_{14}$ due to the voltage drop within the MOS transistor 15 and becomes, for example, about 2.9 Volts.

The potentials $V_{21}$ and $V_{22}$ of the data line 21 and the inverted data line 22 become substantially equal to the potentials $V_{13}$ and $V_{14}$ due to the same reason as described above.

Upon writing, the inverted write enable signal $\overline{WE}$ supplied to the terminal 28 of the data line drive circuit 20 is made a low level so that the MOS transistors 23 and 24 are both turned off. Also, the write enable signal WE supplied to the terminal 29 is made a high level so that the MOS transistors 25 and 26 are both turned on. As a result, the data line 21 and the inverted data line 22 are connected to the data input terminal D and the inverter 27, respectively. At that time, the MOS transistors 15 to 18 in the memory matrix 10 are all turned on, whereby a first write path extending to the desired memory cell 11 from the data input terminal D through the MOS transistor 25, the data line 21, the MOS transistor 17 and the bit line 13 is established and also a second write path extending to the memory cell 11 through the inverter 27, the MOS transistor 26, the inverted data line 22, the MOS transistor 18 and the inverted bit line 14 is formed, thus a data is written in the memory cell 11.

At that time, since the chip enable signal CE is made high in level, the differential amplifier circuit 30A is in the operable state.

However, in the above mentioned write mode, when the data of "0" is written in the memory cell 11, the output terminal of the inverter 27 becomes the earth potential so that the write current $I_W$ is flowed from the power source terminal P through the MOS transistor 16, the inverted bit line 14, the MOS transistor 18, the inverted data line 22 and the MOS transistor 26.

On the other hand, since the chip enable signal CE is supplied to the MOS transistor 36 in the constant current source of the differential amplifying circuit 30A, regardless of the write mode and the read mode, if the chip enable signal CE is high in level, the operation current Ia is flowed through the differential amplifier circuit 30A and thus a predetermined constant power is consumed.

Accordingly, the power consumption of the memory becomes larger in the write mode.

The above mentioned write current $I_W$ and the operation current Ia of the differential amplifier circuit 30A become relatively as large as 1 mA and 3 mA per one bit respectively although they are different dependent on the operation speed of the memory.

An embodiment of the sense amplifier according to the present invention will hereinafter be described with reference to FIG. 3.

Figure 3:
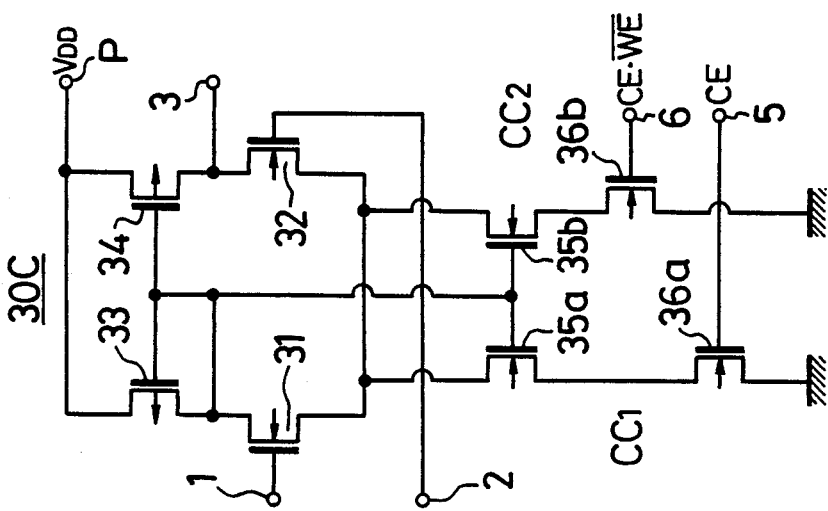
FIG. 3 is a circuit diagram showing an embodiment of a sense amplifier of the memory circuit according to the present invention.

Referring to FIG. 3, in a sense amplifier 30C according to this embodiment, instead of the constant current source transistor 35 and the switching transistor 36 used in the sense amplifier 30A shown in FIG. 1, there are provided first and second constant current source MOS transistors 35a and 35b and first and second switching MOS transistors 36a and 36b, respectively. The drains of the first and second constant current source MOS transistors 35a and 35b, are connected to the mutually connected sources of the differential input MOS transistors 31 and 32, while the respective sources thereof are grounded through the drain-source paths of the switching MOS transistors 36a and 36b, thus constructing first and second constant current circuits CC1 and CC2, respectively. A bias voltage is supplied from the diode-connected P-channel MOS transistor 33 to the gates of the constant current source MOS transistors 35a and 35b. The first constant current source MOS transistor 35a is made equal to the series-connected small switching MOS transistor 36a in area. While, the second constant current source MOS transistor 35b is made equal to the series-connected large switching MOS transistor 36b in area.

In this case, both the constant current source MOS transistors 35a and 35b can be replaced by a single MOS transistor having an area equal to the sum of the areas of the transistors 35a and 35b.

The operation of the sense amplifier according to this embodiment will be described below.

In the reading mode, the chip enable signal CE is made high in level and the inverted write enable signal $\overline{WE}$ is made also high in level. Accordingly, a chip enable and inverted write enable signal CE·$\overline{WE}$ which is the product of both the signals CE and $\overline{WE}$ becomes high in level. Such chip enable signal CE and the chip enable and inverted write enable signal CE·$\overline{WE}$ are supplied to the respective gates of the MOS transistors 36a and 36b from the terminals 5 and 6 so that the MOS transistors 36a and 36b are both turned on, whereby the initial stage differential amplifier circuit 30C in the sense amplifier is placed in the normal operable state and thus the normal operation current Ia of, for example, 3 mA is flowed therethrough.

While, in the write mode, the chip enable signal CE is made high in level and the inverted write enable signal $\overline{WE}$ is made low in level. Accordingly, the chip enable and inverted write enable signal CE·$\overline{WE}$ which is the product of both the signals CE and $\overline{WE}$ becomes low in level. Such chip enable signal CE and chip enable and inverted write enable signal CE·$\overline{WE}$ are supplied from the terminals 5 and 6 to the respective gates of the MOS transistors 36a and 36b so that the MOS transistor 36a is turned on while the MOS transistor 36b is turned off. As a result, the initial stage differential amplifier 30C of the sense amplifier is set in the current-limited operation state in which the operation current Ia is limited to 0.6 mA which is 1/5 the normal value of, for example, 3 mA. Thus, the operation current can be reduced by the amount more than, for example, the write current $I_W$ of 1 mA.

Consequently, the power consumption by the differential amplifier circuit 30C in the write mode can be reduced and hence the overall power consumption of the memory can be reduced.

Subsequently, another embodiment of the sense amplifier according to the present invention will hereinafter be described with reference to FIG. 4.

Figure 4:
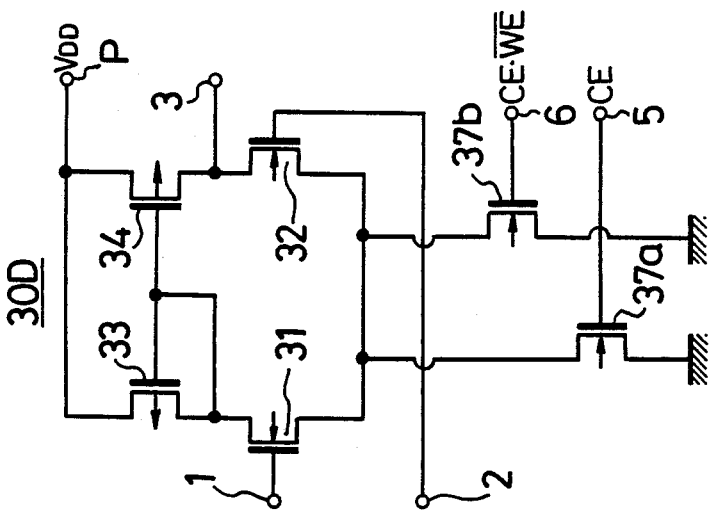
FIG. 4 is a circuit diagram showing another embodiment of the sense amplifier according to the present invention.

In FIG. 4, reference numeral 30D designates an initial stage amplifier circuit used in the sense amplifier. In this initial stage differential amplifier 30D, instead of the switching and constant current source MOS transistor 37 described as above in connection with FIG. 2, first and second N-channel MOS transistors 37a and 37b are used. In this case, the mutually connected sources of the differential input MOS transistors 31 and 32 are connected with a drain of the small (narrowband) N-channel MOS transistor 37a which is used as a first constant current source serving as a switch and also connected with the drain of the large (wideband) N-channel MOS transistor 37b which is used as a second constant current source serving as a switch. The areas (widths) of both the MOS transistors 37a and 37b are set as, for example, 1/5 and 4/5 of the area (width) of the constant current source MOS transistor 37 shown in FIG. 2, respectively. The gate of the small MOS transistor 37a is connected to the chip enable signal input terminal 5, while the gate of the large MOS transistor 37b is connected to the chip enable and inverted write enable signal input terminal 6. Further, the respective sources of both the MOS transistors 37a and 37b are grounded, thus constructing first and second constant current circuits.

Also in this embodiment, upon reading mode, the differential amplifier circuit 30D is placed in the normal operation state and then it is placed in the current-limited operation state in the write mode so that the power consumption thereof in the write mode can be reduced considerably.

Since a signal which is the same as the signal written in the data line in phase is produced at the output of the sense amplifier which is set in the above mentioned operation state, the external write circuit can be protected from the interference.

Further embodiment of this invention will be described with reference to FIG. 5.

Figure 5:
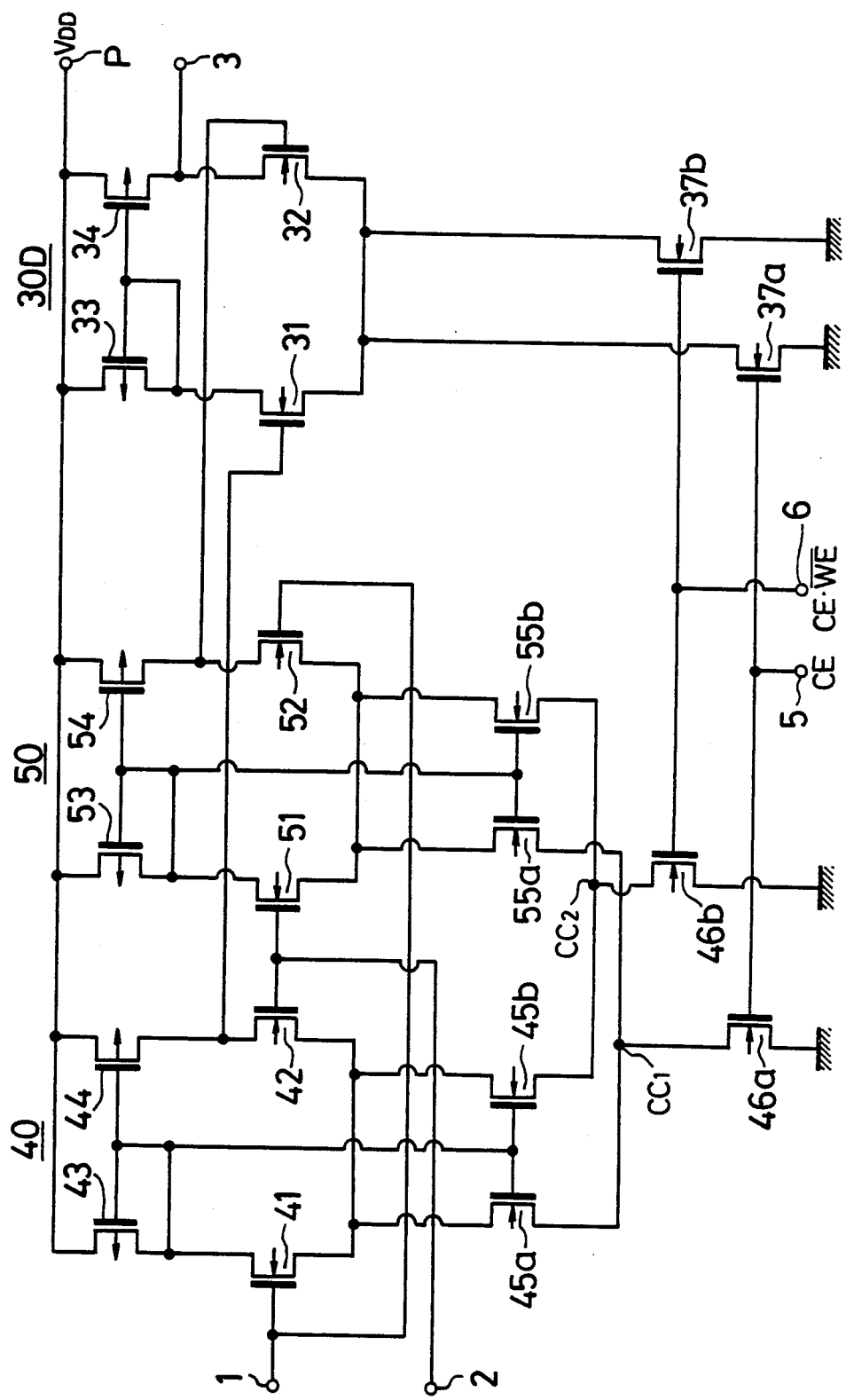
FIG. 5 is a circuit diagram showing further embodiment of the present invention.

As illustrated in FIG. 5, differential amplifier circuits 40 and 50 are constructed similarly to the differential amplifier circuit 30C shown in FIG. 3, respectively. Accordingly, in FIG. 5, like parts corresponding to those of FIG. 3 are marked with reference numerals whose first digits are the same as those of FIG. 3 and whose second digits are marked with 4 and 5. Hence, they will not be described in detail. A third differential amplifying circuit 30D is constructed in exactly the same way as the differential amplifying circuit 30D shown in FIG. 4. In accordance with this embodiment, a balance type initial stage amplifier circuit is constructed by both the differential amplifier circuits 40 and 50, whereby the equi-phase noise suppressing ratio can be improved.

Referring to FIG. 5, one input terminal 1 is connected commonly to a gate of one input MOS transistor 41 of the first differential amplifier circuit 40 and a gate of the other input MOS transistor 52 of a second differential amplifier circuit 50. Also, the other input terminal 2 is connected commonly to a gate of the other input MOS transistor 42 of the first differential amplifier circuit 40 and a gate of one input MOS transistor 51 of the second differential amplifier circuit 50.

The drains of the other input MOS transistors 42 and 52 of the first and second differential amplifier circuits 40 and 50 are connected respectively to gates of both input MOS transistors 31 and 32 of the third differential amplifier circuit 30D.

Respective sources of small constant current source MOS transistors 45a and 55a of the first and second differential amplifier circuits 40 and 50 are grounded via a drain-source path of a small switching MOS transistor 46a, thus the first constant current circuit CC1 being constructed. Also, respective sources of large constant current source MOS transistors 45b and 55b are grounded via a drain-source path of a large switching MOS transistor 46b, thus constructing the second constant current circuit CC2. In this case, the area of the small switching MOS transistor 46a is set equal to the sum of the areas of both the small constant current source MOS transistors 45a and 55a, while the area of the large switching MOS transistor 46b is set equal to the sum of the areas of both the large constant current source MOS transistors 45b and 55b.

The gates of both the switching MOS transistors 46a and 46b are connected to the chip enable input terminal 5 and the chip enable signal and inverted write enable signal input terminal 6 respectively together with the gates of the switching MOS transistors 37a and 37b which are served as the constant current source of the third differential amplifier circuit 30D.

Also in accordance with this embodiment, similarly to the embodiments shown on FIGS. 3 and 4, upon reading mode, the differential amplifier circuit can be set in the normal operation mode and can be placed in the current-limiting operation mode upon write mode. According to this embodiment, since three differential amplifier circuits 30D, 40 and 50 are controlled simultaneously, the power consumption in the write mode can be reduced more.

According to the present invention as set forth above, a plurality of constant current circuits are provided in the differential amplifier circuit contained in the sense amplifier and at least one constant current circuit is interrupted by the inverted write enable signal so that it becomes possible to obtain the sense amplifier which can considerably reduce the power consumption in the write mode.

By the way, in the data line drive circuit 20 shown in FIG. 1, when the power source voltage $V_{DD}$ is lowered to, for example, about 3 Volts due to the overload and the like, the potentials $V_{21}$ and $V_{22}$ of the data line 21 and the inverted data line 22 are lowered to about 1.5 Volts. This voltage value is too low as the input voltage applied to the initial stage differential amplifier circuit 30A used in the sense amplifier. There is then a problem that the sense amplifier can not be operated anymore.

Further, the potentials $V_{21}$ and $V_{22}$ of both the data lines 21 and 22 become equal to the potentials $V_{13}$ and $V_{14}$ of both the bit lines 13 and 14. As a result, the drain-source voltage $V_{DS}$ of the column selection MOS transistors 17 and 18 becomes very small so that the driving ability of these MOS transistors 17 and 18 are lowered. Then, even when the respective channel widths of the column selection MOS transistors 17 and 18 and the MOS transistors 23 and 24 of the data line drive circuit 20 are increased to, for example, four times the channel widths of the bit line drive MOS transistors 15 and 16, a large data line current can not be flowed so that the reading at high speed can not be made.

In the prior art memory, the junction capacities $C_{17}$ and $C_{18}$ of the column selection MOS transistors 17 and 18 become stray capacities of the data line 21 and the inverted data line 22, respectively. In the memory having a capacity of, for example, 64k bits, the number of columns becomes 256 whereby a considerably large stray capacity is added to the data line 21 and the inverted data line 22. In addition, in the prior art memory, the drain-source voltage $V_{DS}$ of the MOS transistors 17 and 18 are low so that their junction capacities $C_{17}$ and $C_{18}$ are large. Then, there is a problem that the data line 21 and the inverted data line 22 are obstructed from being driven at high speed.

Figure 6:
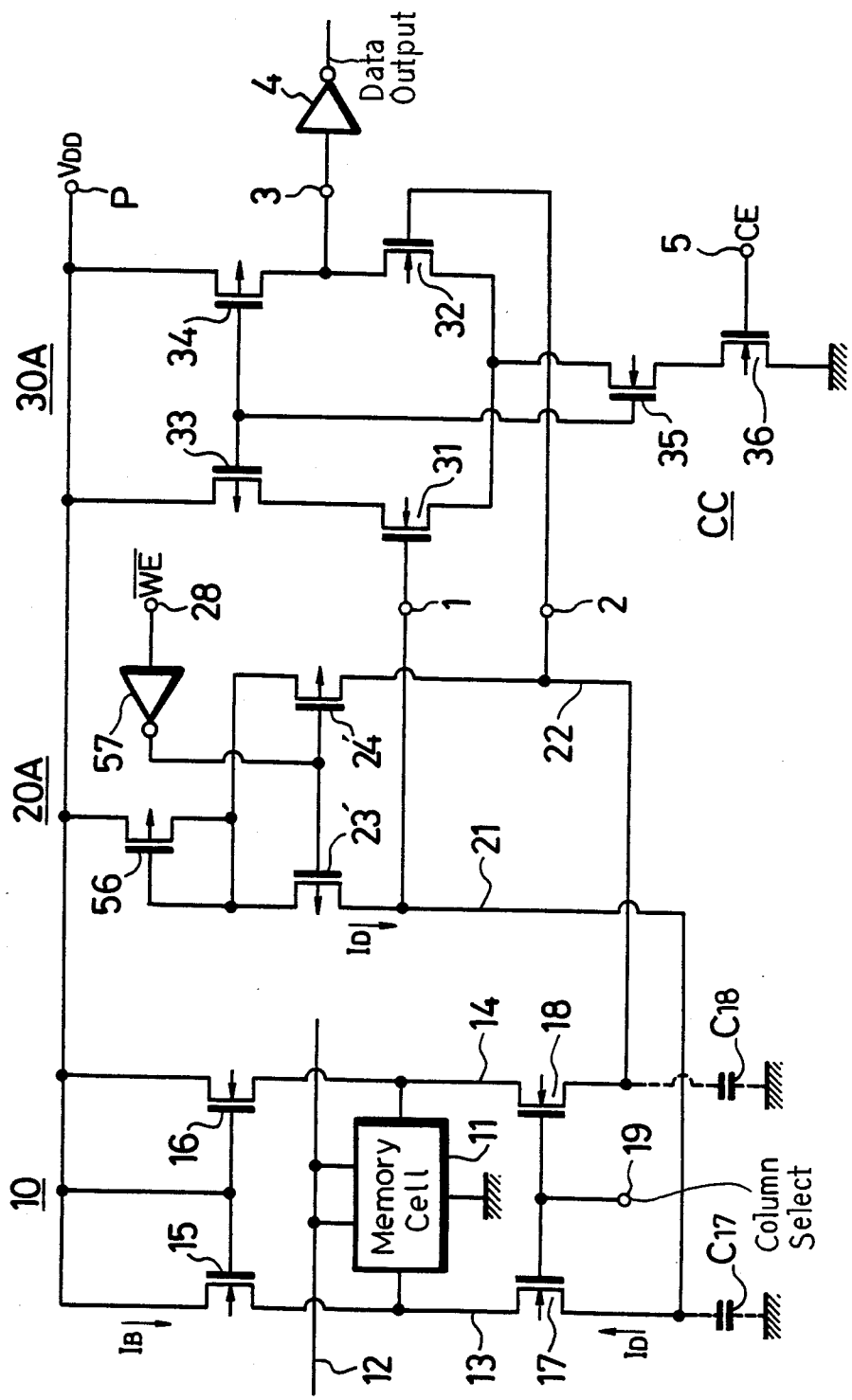
FIG. 6 is a circuit diagram showing other embodiment of the memory circuit according to the present invention.

Therefore, in this invention, as shown in FIG. 6, there is provided a data line drive circuit 20A, in which drains of a pair of P-channel MOS transistors 23' and 24' which are used as the active loads are connected to the data line 21 and the inverted data line 22, respectively and the mutually-connected sources thereof are connected through a diode-connected P-channel MOS transistor 56 to the power source terminal P. The MOS transistors 23' and 24' are supplied at their gates with the inverted write enable signal $\overline{WE}$ from the terminal 28 through an inverter 57.

The operation of this embodiment will be described below.

In the case of the reading mode, the inverted write enable signal $\overline{WE}$ supplied to the terminal 28 is made high in level. This inverted write enable signal $\overline{WE}$ is inverted by the inverter 57 so as to become low in level and then is supplied to the respective gates of the active load MOS transistors 23' and 24' so that both the MOS transistors 23' and 24' are turned on. Since the operation points thereof are selected within the triode areas, both the MOS transistors 23' and 24' are operated as resistors and thus the equivalent circuit in this embodiment becomes as shown in FIG. 7.

Since in this embodiment the P-channel MOS transistors 23' and 24' are used as the active loads to thereby exclude the base effect $\Delta V$th (the fluctuation of the threshold voltage by the source voltage), when the power source voltage is 5 Volts, the potentials $V_{21}$ and $V_{22}$ of the data line 21 and the inverted data line 22 are increased to about 3.9 Volts and about 4.1 Volts, respectively.

Accordingly, as described earlier, even when the power source voltage $V_{DD}$ is lowered to about 3 Volts, the potentials $V_{21}$ and $V_{22}$ of both the data line 21 and the inverted data line 22 are kept at about 2 Volts so that the sense amplifier can be operated stably.

Further, since the potentials of both the data line 21 and the inverted data line 22 become higher than those of both the bit lines 13 and 14 by about 1 Volt, the drain-source voltage $V_{DS}$ of the column selection MOS transistors 17 and 18 becomes large so that the drive ability thereof is increased and thus a large data line current can be flowed. As a result, the reading at high speed becomes possible. Furthermore, since the drain-source voltage $V_{DS}$ of the column selection MOS transistors 17 and 18 becomes large, the junction capacities $C_{17}$ and $C_{18}$ thereof are reduced so that the stray capacities of both the data line 21 and the inverted data line 22 are reduced. This contributes much to the high speed data reading.

Other embodiment of the data line drive circuit according to this invention will be described with reference to FIG. 8.

In FIG. 8, reference numeral 20B designates a data line drive circuit. In this data line drive circuit 20B, the respective drains of a pair of P-channel MOS transistors 23' and 24' which are used as the active loads are connected respectively to the data line 21 and the inverted data line 22 and the mutually-connected sources thereof are connected through a diode-connected N-channel MOS transistor 56' to the power source terminal P. The substrate of the MOS transistor 56' is connected to its source. Both the MOS transistors 23' and 24' are supplied at their gates with the inverted write enable signal $\overline{WE}$ from the terminal 28 through the inverter 57.

In this embodiment shown in FIG. 8, in the diode-connected N-channel MOS transistor 56', its base and source are connected and both the active load MOS transistors 23' and 24' are each of a P-channel type so that the base effect $\Delta V$th is removed.

Further embodiment of the data line drive circuit according to this invention will be described with reference to FIG. 9.

Figure 9:
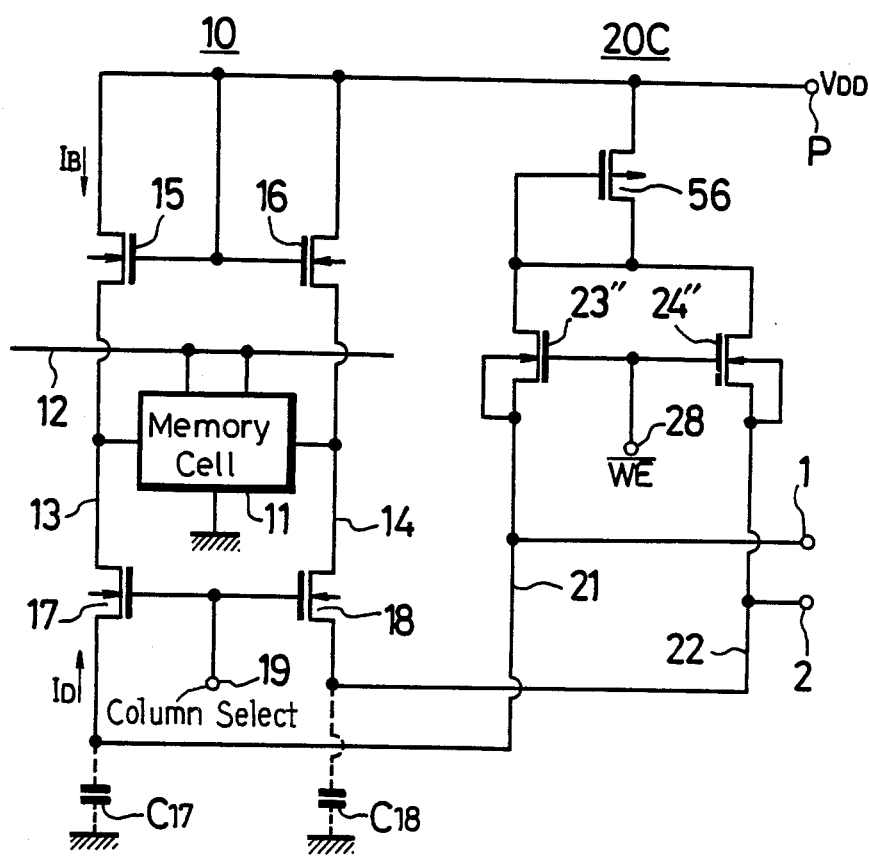
FIG. 9 is a circuit diagram showing other embodiment of the memory circuit according to the present invention.

Referring to FIG. 9, reference numeral 20C designates a data line drive circuit 20C, in which sources and substrates of a pair of N-channel MOS transistors 23" and 24" used as the active loads are respectively connected to the data line 21 and the inverted data line 22 and the mutually connected drains thereof are connected through the diode-connected P-channel MOS transistor 56 to the power source terminal P. Both the MOS transistors 23" and 24" are supplied at their gates with the inverted write enable signal $\overline{WE}$ from the terminal 28.

In this embodiment, the bases and sources of both the N-channel MOS transistors 23" and 24" used as the active loads, are connected so that the base effect $\Delta V$th can be removed.

Further embodiment of the data line drive circuit according to the present invention will be described with reference to FIG. 10.

Figure 10:
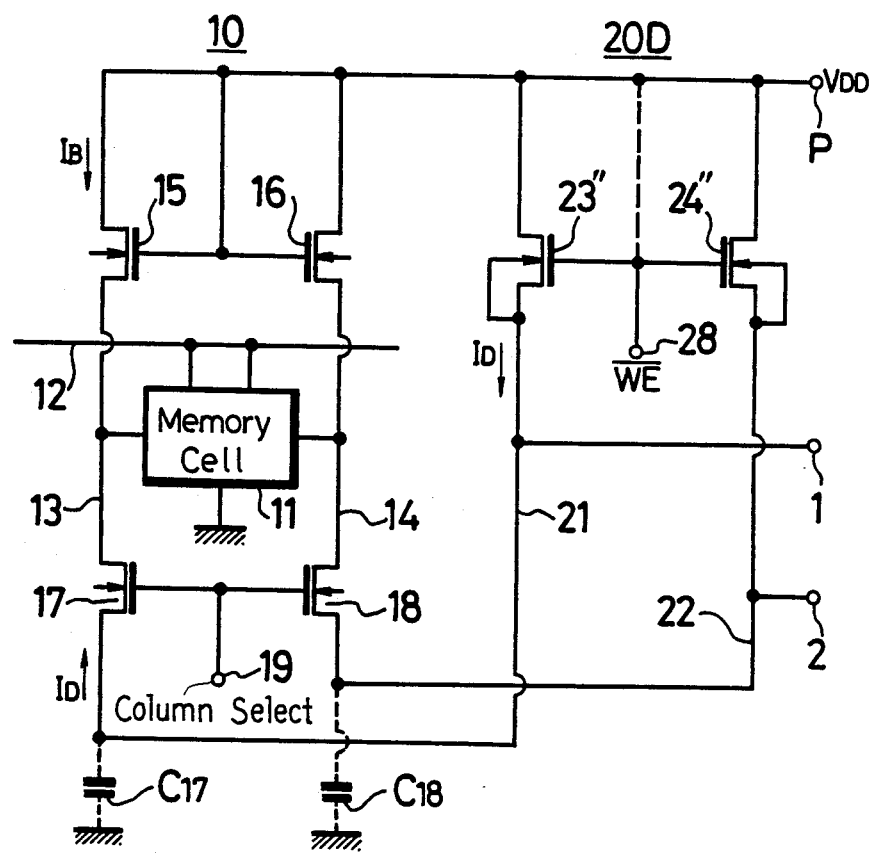
FIG. 10 is a circuit diagram showing further embodiment of the memory circuit according to the present invention.

Referring to FIG. 10, reference numeral 20D denotes a data line drive circuit in which respective sources and substrates of a pair of N-channel MOS transistors 23" and 24" used as the active loads are connected together to the data line 21 and the inverted data line 22, while the mutually-connected drains thereof are connected to the power source terminal P. Both the MOS transistors 23" and 24" are supplied at their gates with the inverted write enable signal $\overline{WE}$ from the terminal 28.

Also in this embodiment, the substrates and the sources of both the N-channel MOS transistors 23" and 24" used as the active loads are connected so that the base effect $\Delta V$th can be removed. Further in this embodiment, upon reading, both the active load MOS transistors 23" and 24" are diode-connected as shown by a broken line. As a result, the potential of the data line having a higher level becomes $V_{DD}-V$th which falls within a proper range as the input voltage to the sense amplifier.

According to the present invention as described above, the base effect $\Delta V$th of the active load MOS transistor for the data line is removed so that the potentials of the data lines can be increased. Accordingly, even when the power source voltage is lowered, the reading operation can be made stably.

Since the potential at the data line can be made considerably higher than that of the bit line, the drive ability of the column selection MOS transistor can be increased and the junction capacity thereof can be reduced, thus making the high speed reading possible.

However, the potentials or voltages $V_{21}$ and $V_{22}$ of the data lines 21 and 22 are increased to about 3.9 Volts and about 4.1 Volts respectively as described above. Then, there occurs such a problem that it takes much time for the memory circuit to change its mode from the write mode to the read mode. In other words, upon write operation mode, the voltages $V_{21}$ and $V_{22}$ of the data lines 21 and 22 are about 3.2 Volts for high level and about 0.3 Volts for the low level. When the memory circuit changes its mode from the write operation mode to the read operation mode, the voltages $V_{21}$ and $V_{22}$ of the data lines 21 and 22 upon write mode must be increased from about 0.3 Volts and about 3.2 Volts to about 3.9 Volts and about 4.1 Volts of the voltages $V_{21}$ and $V_{22}$ of the data lines 21 and 22 upon read operation mode. If the voltages $V_{21}$ and $V_{22}$ of the data lines 21 and 22 upon the reading mode are increased as described above, a difference voltage between the voltages $V_{21}$ and $V_{22}$ of the data lines 21 and 22 becomes large upon the writing mode so that a reading (write recovery) time just after the write operation mode is changed to the read operation mode must become long.

Therefore, further embodiment of the data line drive circuit according to the present invention will be described with reference to FIG. 11.

Figure 11:
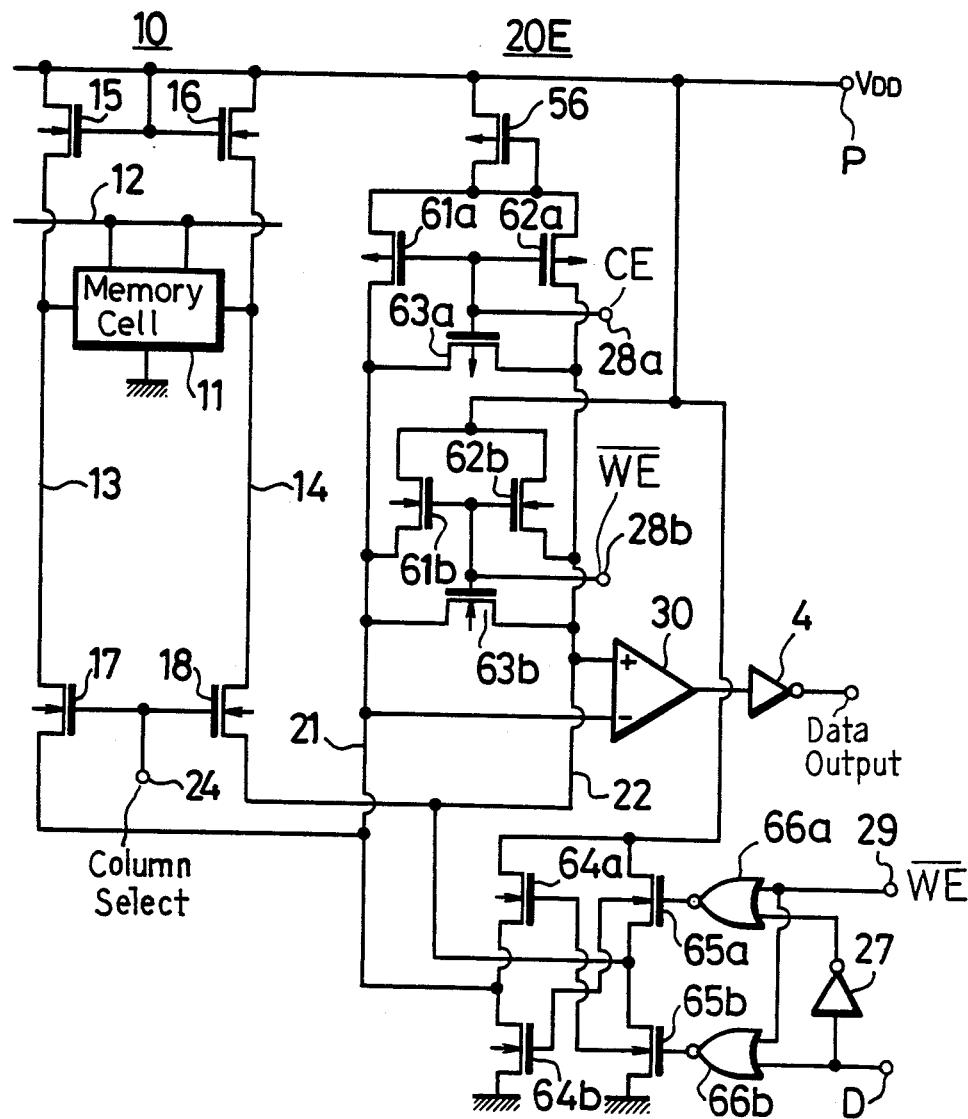
FIG. 11 is a circuit diagram showing yet further embodiment of the memory circuit according to the present invention.

In accordance with this embodiment, as illustrated in FIG. 11, in a data line drive circuit 20E of this embodiment, between the data line 21 and the inverted data line 22, there are connected a pull-up circuit and an equalizer circuit formed of P-channel MOS transistors 61a, 62a and 63a and a pull-up circuit and an equalizer circuit formed of N-channel MOS tansistors 61b, 62b and 63b, respectively.

Specifically, the source of the P-channel MOS transistor 56 is connected to the power source terminal P and the gate and the drain of the MOS transistor 56 are connected commonly. This common connection point or junction is connected to the sources of the P-channel MOS transistors 61a and 62a. The gates of the MOS transistors 61a and 62a are connected commonly and a terminal 28a is led out from the junction between the gates of the MOS transistors 61a and 62a. This junction is further connected to the gate of the equalizing MOS transistor 63a connected between the data line 21 and the inverted data line 22. The drains of the MOS transistors 61a and 62a are connected to the data line 21 and the inverted data line 22, respectively.

The drains of the N-channel MOS transistors 61b and 62b are connected together to the power source terminal P. The gates of the MOS transistors 61b and 62b are connected commonly and from this junction, a terminal 28b is led out. Also, this junction is connected to the gate of the equalizing N-channel MOS transistor 63b provided between the data line 21 and the inverted data line 22. The sources of the MOS transistors 61b and 62b are connected to the data line 21 and the inverted data line 22, respectively. Further, the data line 21 is connected to a connection point at which a MOS transistor 64a and a MOS transistor 64b provided between the power source terminal P and the ground are connected in series. The data line 22 is connected to connection point at which a MOS transistor 65a and a MOS transistor 65b provided between the power source terminal P and the ground are connected in series.

The gates of the MOS transistors 64a and 65b are connected commonly and this junction therebetween is connected to an output terminal of a NOR gate 66b. The gate of the MOS transistor 64b and the gate of the MOS transistor 65a are connected commonly and this junction therebetween is connected to an output terminal of a NOR gate 66a. One input terminals of the NOR gates 66a and 66b are connected to a terminal 29 while the other input terminals of the NOR gates 66a and 66b are connected together via the inverter 27. A junction between the other input terminal of the NOR gate 66b and the inverter 27 is connected to the data input terminal D.

Upon writing mode, the inverted write enable signal $\overline{WE}$ applied to the terminals 29 and 28a is made low in level. Accordingly, a data applied to the data input terminal D is supplied through the MOS transistors 17 and 18 and the bit lines 13 and 14 to the memory cell 11 and thereby the data is stored in the memory cell 11.

To be more concrete, when the inverted write enable signal $\overline{WE}$ applied to the terminal 29 becomes low in level, the NOR gates 66a and 66b are opened and the input data applied to the data input terminal D is derived via the NOR gates 66a and 66b. The NOR gate 66a is supplied with the inverted data through the inverter 27, while the NOR gate 66b is supplied with the data from the data input terminal D so that the positive data is generated from the NOR gate 66a while the inverted data is generated from the NOR gate 66b. When the output of the NOR gate 66a is high in level, the MOS transistors 64b and 65a are turned on. Whereas, when the output of the NOR gate 66b is high in level, the MOS transistors 64a and 65b are turned on. Accordingly, when the input data is high in level, the junction between the MOS transistors 65a and 64b becomes low in level and the junction between the MOS transistors 64a and 65b becomes high in level. When the input data is low in level, the junction between the MOS transistors 65a and 64b becomes high in level and the junction between the MOS transistors 64a and 65b becomes low in level.

Upon reading, when the chip enable signal CE is made low in level and the inverted write enable signal $\overline{WE}$ is made high in level, the low level is applied to the terminal 28a and the high level is supplied to the terminals 28b and 29 so that the mode of the momory is changed from the write mode to the read mode.

As described before, the voltages $V_{21}$ and $V_{22}$ of the data line 21 and the inverted data line 22 in the write mode are respectively about 0.3 Volts and about 3.2 Volts where the power source voltage $V_{DD}$ is taken as 5 Volts, the threshold voltage Vth is taken as 0.7 Volts and the base effect $\Delta$Vth is taken as 1.1 Volts. Accordingly, when the high level is applied to the terminal 28b, at first the MOS transistors 61b and 62b and the equalizing MOS transistor 63b are turned on, respectively. Since the MOS transistors 61b and 62b are each of an N-channel MOS transistor, if the MOS transistors 61b and 62b are turned on, the voltages $V_{21}$ and $V_{22}$ of the data line 21 and the inverted data line 22 are increased up to 3.2 Volts. Further, since the equalizing MOS transistor 63b is turned on, a voltage difference between the bit lines 13 and 14 can be reduced.

If the voltage of one data line 21 or 22 having a higher level is lowered too much, this affects the bit lines 13 and 14 so that the equalizing MOS transistor 63b will be mis-operated. For this reason, the magnitude of the voltage of the MOS transistor 63b must be set at an optimum value.

When the voltages $V_{21}$ and $V_{22}$ of the data line 21 and the inverted data line 22 are increased up to 3.2 Volts, the MOS transistors 61b, 62b and the MOS transistor 63b are turned off.

At that time, since the low level is applied to the terminal 28a, the MOS transistors 61a, 62a and 63a are made in their on-state. After the voltages $V_{21}$ and $V_{22}$ of the data line 21 and the inverted data line 22 are increased up to 3.2 Volts, the voltages $V_{21}$ and $V_{22}$ of the data line 21 and the inverted data line 22 are increased up to 4 Volts and 3.7 Volts by the P-channel MOS transistors 61a and 62a, respectively.

In this case, the equalizing MOS transistor 63a is provided to limit the amplitudes of the data line 21 and the inverted data line 22. Since the equalizing MOS transistor 63a is provided, the time necessary for inverting the data can be reduced.

Figure 12:
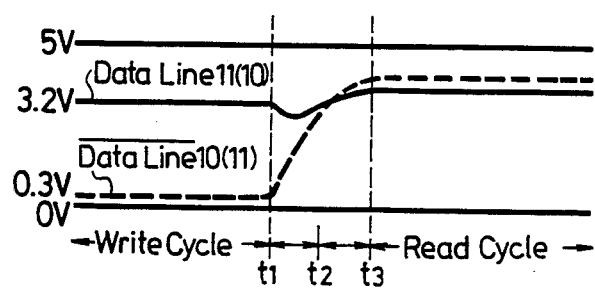
FIG. 12 is a timing chart used to explain the operation of the embodiment of the present invention shown in FIG. 11.

As described above, when the mode of the memory is changed from the writing operation mode to the reading operation mode, the voltages $V_{21}$ and $V_{22}$ of the data line 21 and the inverted data line 22 are increased by the pull-up circuit formed of the N-channel MOS transistors 61b, 62b and the pull-up circuit formed of the P-channel MOS transistors 61a, 62a. In other words, referring to FIG. 12, when the mode of the memory is changed from the writing operation mode to the reading operation mode, the voltages $V_{21}$ and $V_{22}$ of the data line 21 and the inverted data line 22 are increased by the pull-up circuit formed of the MOS transistors 61b, 62b and the pull-up circuit formed of the MOS transistors 61a, 62a during a time period ranging from a time point $t_1$ to a time point $t_2$. While, the voltage $V_{21}$ or $V_{22}$ of the data line 21 or the inverted data line 22 to which the high level data is transmitted is lowered by the equalizing MOS transistor 63b. During a time period ranging from a time point $t_2$ to $t_3$ in which the voltages $V_{21}$ and $V_{22}$ of the data line 21 and the inverted data line 22 are reached to 3.2 Volts, the N-channel MOS transistors 61b, 62b and the MOS transistor 63b are turned off. Then, the voltages $V_{21}$ and $V_{22}$ of the data line 21 and the inverted data line 22 are increased by the MOS transistors 61a, 62a so that the memory can be placed in the reading mode from a time point $t_3$.

According to the present invention as described above, when the memory is changed in mode from the write mode to the read mode, the voltages of the data lines are increased by the first pull-up circuit formed of the P-channel MOS transistors and the second pull-up circuit formed of the N-channel MOS transistors. When the voltages of the data lines are increased up to the predetermined values, the second pull-up circuit formed of the N-channel MOS transistors is made in the off-state. Accordingly, when the memory is changed in mode from the write mode to the read mode, the voltages of the data lines are increased momentarily so that the time required by the memory to change its mode from the write mode to the read mode can be reduced.

Figure 13:
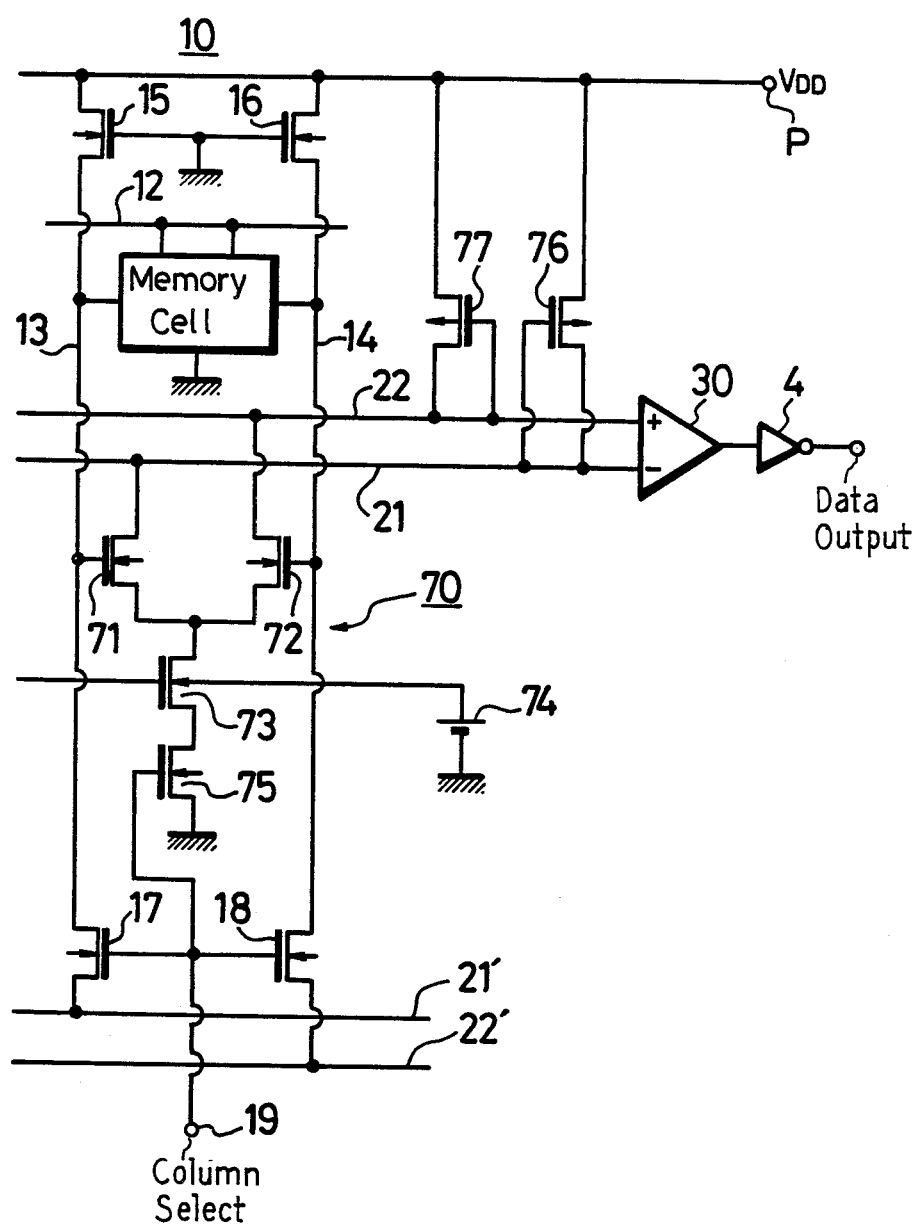
FIG. 13 is a circuit diagram showing yet further embodiment of the memory circuit according to the present invention.

In such memory circuit, there is such a case that as shown in FIG. 13, a read data is supplied to a pre-sense amplifier 70 formed of MOS transistors 71 and 72, and the output of this pre-sense amplifier 70 is supplied to a main sense amplifier 30 from which an output data is derived. As a load circuit of this pre-sense amplifier, in the prior art, there is a case where a current mirror circuit formed of MOS transistors is used.

Referring to FIG. 13, the bit line 13 and the inverted bit line 14 are connected with the gates of the MOS transistors 71 and 72 which construct the pre-sense amplifier 70. As each of the MOS transistors 71 and 72, there is used an N-channel MOS transistor. The sources of the MOS transistors 71 and 72 are connected commonly and this junction is connected to a drain of a MOS transistor 73 which acts as a constant current source. A differential amplifier is constructed by the MOS transistors 71 and 72. The MOS transistor 73 is driven by a DC power source 74. The source of the MOS transistor 73 is grounded via a switching MOS transistor 75 whose gate is connected to a column signal input terminal 19.

The drains of the MOS transistors 71 and 72 are connected to the read data line 21 and the inverted read data line 22, respectively. The data line 21 and the inverted data line 22 are connected with a pair of load MOS transistors of, for example, P-channel and of which the sources are connected to the power source terminal P. The gates of these MOS transistors are connected commonly and this junction is connected to a drain of one MOS transistor and hence a current mirror circuit is constructed. This current mirror circuit is operated as a load current mirror circuit for the MOS transistors 71 and 72 constructing the pre-sense amplifier 70.

In other words, when the high level is applied to the gate of the MOS transistor 72 while the low level is applied to the gate of the MOS transistor 71, the MOS transistor 72 is turned on while the MOS transistor 71 is turned off. At that time, the equal current is flowed to the MOS transistors which construct the current mirror circuit. The current flowing through one MOS transistor is flowed to the stray capacity of the data line 21 because the MOS transistor 71 is turned off, whereby the voltage of the data line 21 is increased.

When the high level is applied to the gate of the MOS transistor 71 and the low level is applied to the gate of the MOS transistor 72, the MOS transistor 71 is turned on and the MOS transistor 72 is turned off. As a result, the current flowing through the other MOS transistor constructing the current mirror circuit is decreased and the current flowing through the one MOS transistor constructing the current mirror circuit is reduced. The charge accumulated in the capacity of the data line 21 is discharged through the MOS transistor 71 so that the voltage at the data line 21 is lowered. Consequently, the amplitude of the output voltage of the pre-sense amplifier 70 becomes large so that the time necessary for inverting the read data becomes long.

In other words, the stray capacities exist in the data line 21 and the inverted data line 22 and the output of the pre-sense amplifier 70 is derived by charging and discharging this capacities. Accordingly, the output voltage of this pre-sense amplifier 70 is increased or lowered in accordance with the charging and discharging time of the capacities and the amplitude becomes large. This amplitude becomes, if the size of the load MOS transistors forming the current mirror circuit is made large and a resistance $r_{DS}$ thereof is made small properly, an amplitude (1.0 Vp−p) or above in the bit lines 13 and 14.

If the conductance gm of the MOS transistors 71 and 72 in the pre-sense amplifier 70 is reduced in order to suppress the amplitude of the pre-sense amplifier 70, the current gain can not be increased and sufficient charge and discharge currents can not be flowed to the stray capacities of the data line 21 and the inverted data line 22. As a result, the amplitude of the output from the pre-sense amplifier 70 becomes small, while the inverting time can never be reduced.

When the memory cell 11 in the row direction is accessed, an equalizing circuit is frequently provided, in which the address transition is detected so as to generate an internal pulse and the bit lines 13 and 14 are balanced by this pulse to thereby make the high speed operaton possible. However, in the column side, the access for the column direction selects the data which is generated in the bit line after the access in the row direction is made so that the access time is shorter than the access time in the row direction essentially. Accordingly, the provision of the equalizing circuit leads to the increase of the chip area and the increase of the power consumption. Hence, no equalizing circuit is provided in the column side.

Therefore, in the present invention, as shown in FIG. 13, gates and drains of respective diode-connected MOS transistors 76 and 77 are connected to the data line 21 and the inverted data line 22. As the MOS transistors 76 and 77, there is used a MOS transistor of P-channel. The sources of the MOS transistors 76 and 77 are connected to the power source terminal P.

When the column signal applied to the terminal 19 becomes high in level, the MOS transistor 75 is turned on so that the pre-sense amplifier 70 formed of the MOS transistors 71 and 72 is operated. Accordingly, one memory cell 11 is designated and the data stored in this memory cell 11 is delivered through the bit lines 13 and 14. This data is supplied to the gates of the MOS transistors 71 and 72. The diode-connected MOS transistors 76 and 77 are operated as loads for the MOS transistors 71 and 72 which construct the pre-sense amplifier 70.

If now the bit line 13 is low in level, the bit line 14 is high in level and hence the high level is applied to the gate of the MOS transistor 72 while the low level is applied to the gate of the MOS transistor 71, the MOS transistor 72 is turned on and the MOS transistor 71 is turned off. As a result, by the current flowing through the diode-connected MOS transistor 76, the current is flowed to the capacity of the data line 21, increasing the voltage of the data line 21.

The diode is a non-linear element as shown in FIG. 14 so that when the power source voltage $V_{DD}$ is selected as, for example, 5 Volts, the voltage of the data line 21 at that time is limited by, for example, 4.2 Volts.

When the bit lines 13 and 14 are inverted in level, the low level is applied to the gate of the MOS transistor 72 while the high level is applied to the gate of the MOS transistor 71. Thus, the MOS transistor 71 is turned on and the MOS transistor 72 is turned off. Consequently, the charge accumulated in the capacity of the data line 21 is discharged, lowering the voltage of the data line 21.

In the embodiment shown in FIG. 13, as the load of the pre-sense amplifier 70, there are used the diode-connected MOS transistors 76 and 77. As a result, the amplitude of the pre-sense amplifier 70 is limited without suppressing the current gain so that the high level of the output from the pre-sense amplifier 70 is limited to, for example, 4.2 Volts and the low level thereof is limited to, for example, 3.8 Volts as shown in FIG. 15B by the solid lines.

As will be clear from FIGS. 15A and 15B the amplitude of the pre-sense amplifier 70 is limited so that the inverting time is reduced and the high speed operation becomes possible. More particularly, for the output waveform of the bit line shown in FIG. 15A, a broken line in FIG. 15B illustrates an output waveform of the pre-sense amplifier 70 whose amplitude is not limited, while a solid line in FIG. 15B illustrates an output waveform of the pre-sense amplifier 70 whose amplitude is limited and to which this invention is applied. When the amplitude of the pre-sense amplifier 70 is not limited, relative to the transition time points $T_{01}$ and $T_{02}$ of the data at the bit line, the output of the pre-sense amplifier 70 is inverted at time points $T_{21}$ and $T_{22}$. While, when the amplitude is limited, the output data from the pre-sense amplifier 70 is inverted at time points $T_{11}$ and $T_{12}$ for the transition time points $T_{01}$, $T_{02}$ of the data at the bit line. The time ($T_{01}$ to $T_{11}$ and $T_{02}$ to $T_{12}$) required for the inversion when the amplitude is limited is reduced more than the time ($T_{01}$ to $T_{21}$ and $T_{02}$ to $T_{22}$) necessary for the inversion when the amplitude is not limited. This enables the high speed operation to be carried out.

According to the present invention as described above, the amplitude of the output from the pre-sense amplifier can be limited without suppressing the current gain. As a result, the time necessary for inverting the output of the pre-sense amplifier can be shortened and the high speed read operation becomes possible.

When the above mentioned memory circuit is formed as, for example, 64k-byte type, 32 switching MOS transistors 17 and 18 for selecting the column are connected to the data line 21 and the inverted data line 22. The switching MOS transistors 17 and 18 are connected to the data line 21 and the inverted data line 22 as mentioned above so that a large junction capacity occurs. Further, an aluminum wiring capacity occurs in the data line 21 and the inverted data line 22. Accordingly, a large parasitic capacity occurs in the data line 21 and the inverted data line 22.

If the large parasitic capacity occurs in the data line 21 and the inverted data line 22 as mentioned above, upon read operation, this large parasitic capacity must be driven so that the high speed operation can not be carried out.

Therefore, in order to reduce the parasitic capacity in the data line 21 and the inverted data line 22, it is proposed that the memory circuit in which the common data line 21 and inverted data line 22 are used in the read mode and the write mode is separated in two blocks and the data line 21 and the inverted data line 22 are divided to thereby reduce the lengths of the data line 21 and the inverted data line 22 just one half. However, with the above mentioned circuit arrangement, the column selection N-channel MOS transistor and the switching MOS transistor in the data line dividing circuit are connected in series so that the drive ability of the switching MOS transistor becomes insufficient.

Figure 16:
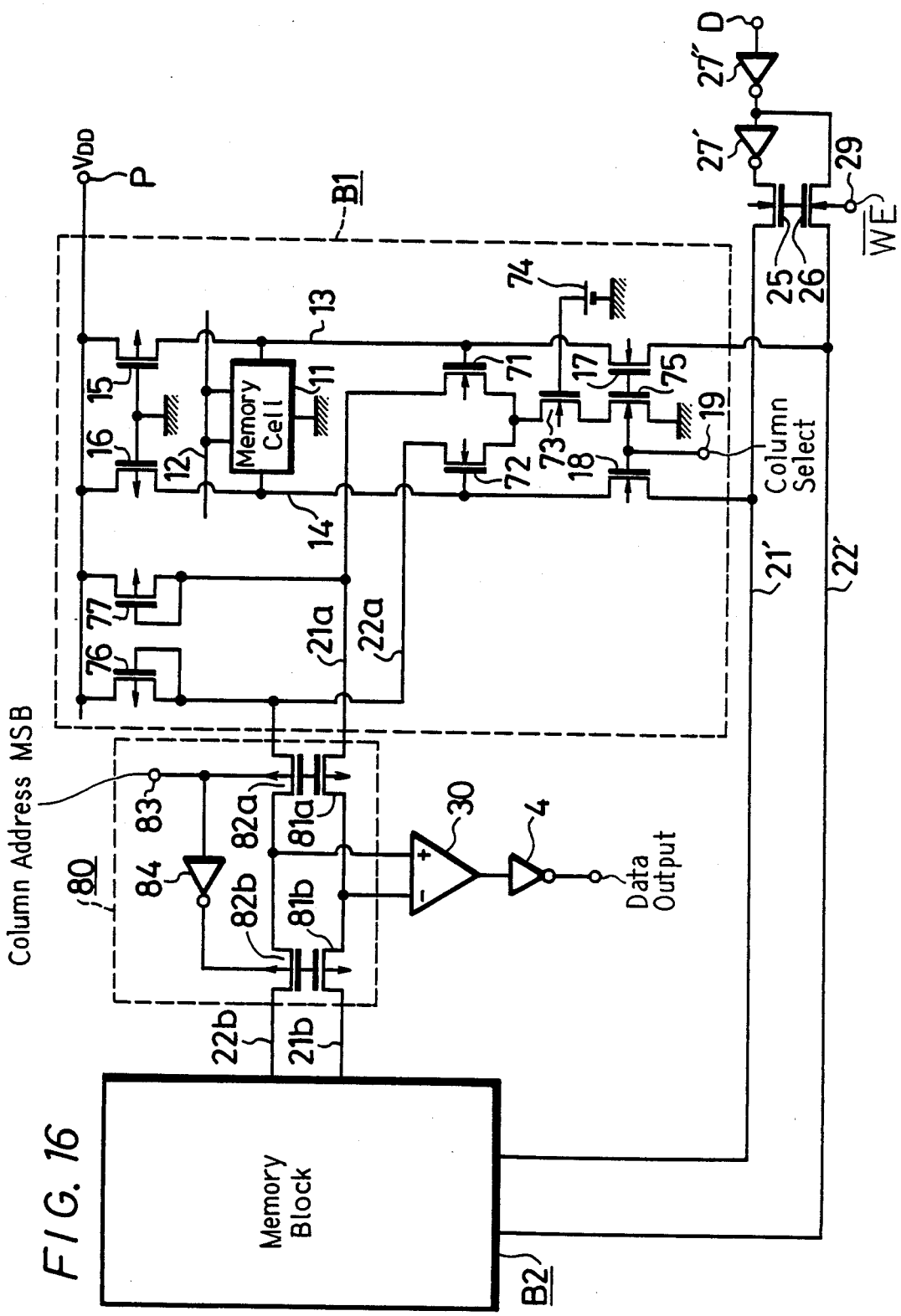
FIG. 16 is a circuit diagram showing still further embodiment of the memory circuit according to the present invention.

Subsequently, further embodiment of the present invention will be described with reference to FIG. 16. According to this embodiment, the memory circuit is formed of two blocks B1 and B2. A plurality of memory cells 11 are provided in each of the blocks B1 and B2 in an X-Y matrix form, respectively. For example, when the memory circuit of 64k-bytes is constructed, the memory cells 11 of 32k-bytes are provided in each of the blocks B1 and B2.

The blocks B1 and B2 are constructed similarly. The data line 21a and the inverted data line 22a from the block B1 are connected to the inverting input terminal and the non-inverting input terminal of the sense amplifier 30 through a switching MOS transistor 81a and a switching MOS transistor 82a. Further, the data line 21b and the inverted data line 22b from the block B2 are connected to the inverting input terminal and the non-inverting input terminal of the sense amplifier 30 via a switching MOS transistor 81b and a switching MOS transistor 82b. A write data line 21' and an inverted write data line 22' are led out from the block B2. One ends of the data line 21' and the data line 22' are connected through a switching MOS transistor 25 and a switching MOS transistor 26 to an output terminal of an inverter 27' and a connection point between the inverters 27' and 27". To the input terminal of the inverter 27", there is connected the data input terminal D. The terminal 29 is connected to the gates of the MOS transistor 25 and the MOS transistor 26.

Upon writing, the MOS transistors 25 and 26 are turned on by the write enable signal WE applied thereto from the terminal 29. Accordingly, the data supplied to the data input terminal D is transmitted via the data line 21' and the inverted data line 22'.

When the row address is designated by the X decoder (not shown), the gate MOS transistors in the memory cells 11 of the corresponding rows in the blocks B1 and B2 are turned on. When the high level is applied to the column selection signal input terminals 19 of the corresponding columns in the blocks B1 and B2 by a column signal from the Y decoder (not shown), the switching MOS transistor 17 and the MOS transistor 18 of the corresponding columns are turned on, respectively. Accordingly, one memory cell 11 in each of the blocks B1 and B2 is designated and a data is written in this memory cell 11 via the write data line 21' and the inverted write data line 22'.

Upon reading, by the write enable signal WE applied to the terminal 29, the MOS transistor 25 and the MOS transistor 26 are respectively turned off. When the row address is designated by the X decoder, the gating MOS transistor in the memory cell 11 at the corresponding row in each of the blocks B1 and B2 is turned on. When the high level is applied to the column selection signal input terminal 19 of the corresponding column in each of the blocks B1 and B2 by the column selection signal from the Y decoder (not shown), the switching MOS transistor 75 of the corresponding column is turned on. Further, when one bit of the column address signal, for example, the MSB (most significant bit) column address signal is supplied to a terminal 83, the switching MOS transistors 81a, 82a and the switching MOS transistors 81b, 82b are controlled so as to be turned on and off by this MSB column address signal.

When the MOS transistor 75 is turned on by the column selection signal, the pre-sense amplifier formed of the MOS transistor 72 and the MOS transistor 71 is operated, whereby one memory cell 11 is designated in each of the blocks B1 and B2. Then, the data stored in the designated memory cell 11 is supplied to the gates of the MOS transistors 71 and 72 which construct the pre-sense amplifier and delivered via the data line 21a and the data line 22a or the data line 21b and the data line 22b.

Either of the MOS transistors 81a, 82a or the MOS transistors 81b, 82b is turned on by the MSB column address signal applied to the terminal 83. Accordingly, the output delivered through the read data lines 21a and 22a led out from the block B1 and the output delivered through the read data lines 21b and 22b led out from the block B2 are selectively supplied to the pre-sense amplifier 30.

The output of the pre-sense amplifier 30 is supplied to the inverter 4 and the output of the inverter 4 is delivered to the output terminal. The output data is derived from this output terminal.

According to this embodiment as described above, the blocks B1 and B2 are separately provided, the read data lines are divided into the data line 21a, the data line 22a and the data line 21b, the data line 22b, and the outputs of the data lines 21a and 22a and the outputs of the data lines 21b and 22b are selected by the data line dividing circuit 80 formed of the MOS transistors 81a, 82a and the MOS transistors 81b, and 82b, whereby the desired read output can be obtained. Therefore, the length of the data lines can be reduced to one-half.

As the load circuit for driving the data lines 21a and 22a or the data lines 21b, 22b, there are used the diode-connected P-channel MOS transistors 76 and 77. Accordingly, the voltage at the data line 21a and the data line 22a or the data lines 21b and 22b become about 4 Volts. Further, as the switching MOS transistors 81a, 82a and the switching MOS transistors 81b, 82b in the data line dividing circuit 80, there are used such one of P channel. Accordingly, it is possible to obtain the sufficient drive abilities of the switching MOS transistors 81a, 82a and the switching MOS transistors 81b, 82b.

According to the present invention as set forth abvoe, the memory circuit is formed of at least two divided blocks and the data line is divided into two data lines. Thus, the parasitic capacity of the data line can be reduced.

Further, according to the present invention, since the read data line and the write data line are separately provided and the read data is obtained by the pre-sense amplifier, the capacities of the bit line and the data line are separated by this pre-sense amplifier and hence the parasitic capacity of the data line can be reduced. Thus, the high speed operation becomes possible.

Furthermore, according to the invention, since the data line is driven by the diode-connected P-channel MOS transistor and the P-channel MOS transistor is used as the switching MOS transistor for the data line dividing circuit, the drive ability of the switching MOS transistor in the data line dividing circuit becomes sufficient and thence the delay done by the division of the data line can be avoided.

The above description is given on the preferred embodiments of the invention but it will be apparent that many modifications and variations could be effected by one skilled in the art without departing from the spirits or scope of the novel concepts of the invention so that the scope of the invention should be determined by the appended claims only.

We claim as our invention:
1. A memory circuit comprising:
   a data input terminal, a data output terminal, a reference voltage source,
   a memory matrix including a plurality of memory cells arranged in matrix form,
   each column of said memory matrix including a bit line and an inverted-bit line connected to corresponding memory cells in the column,
   a data line driving circuit including:

a data line and an inverted data line connected to said bit line and inverted-bit line, respectively, in each column, an active load circuit including two MOS transistors operating in their triode regions while regions while a write enable signal is applied, each of said two MOS transistors being connected between said reference voltage source and one of said data line and said inverted data line, whereby said two MOS transistors operate as resistive elements;

an inverted write enable signal input terminal, a sense amplifier circuit including a differential amplifier having a pair of input transistors in differential configuration with input terminals respectively coupled to said data line and said inverted data line, an output electrode of at least one of said input transistors being connected to said data output terminal, a plurality of constant current sources connected in parallel between a junction of said pair of input transistors and a reference potential, one of said plurality of constant current sources including switching means controlled by the inverted write enable signal so as to be nonconductive during a write operation, at least one of said current sources being conductive during reading and writing.

2. A memory circuit according to claim 1, including means for biasing the substrate of said two MOS transistors in said active load circuit by a reference potential voltage source so as to reduce the base effect.

3. A memory circuit according to claim 1; wherein said plurality of constant current sources of said sense amplifier circuit includes first and second switching means controlled by a chip enable signal and the logical product of said inverted write enable signal and said chip enable signal, respectively.

4. A memory circuit according to claim 1; wherein said data line driving circuit further comprises a diode-connected transistor element connected between said reference voltage source and said first active load circuit.

5. A memory circuit according to claim 1; wherein said active load circuit of said data line driving circuit includes a first pull-up circuit comprised of P-MOS transistors and a first equalizing circuit comprised of a P-MOS transistor, and a second pull-up circuit comprised of N-MOS transistors and a second equalizing circuit comprised of an N-MOS transistor connected between said pair of data line and inverted data line.

6. A memory circuit according to claim 1; further comprising a pre-sense amplifier including a differential amplifier connected to a bit line and an inverted bit line of said memory matrix and to said reference voltage source through a pair of diode-connected P-MOS transistors; the outputs of said pre-sense amplifier being connected to said input transistors of said sense amplifier.

7. A memory circuit according to claim 1; wherein said memory matrix is divided into at least two blocks, each being connected to said sense amplifier through a data line and an inverted data line.

* * * * *